United States Patent [19]

Beard

[11] Patent Number: 4,475,088

[45] Date of Patent: Oct. 2, 1984

[54] GAIN IMBALANCE CORRECTED QUADRATURE PHASE DETECTOR

[75] Inventor: Jerome C. Beard, Pasadena, Md.

[73] Assignee: Westinghouse Electric Corp., Pittsburgh, Pa.

[21] Appl. No.: 524,109

[22] Filed: Aug. 17, 1983

Related U.S. Application Data

[63] Continuation of Ser. No. 270,668, Jun. 4, 1981, abandoned.

[51] Int. Cl.³ .......................... H03L 7/00; H03L 7/06
[52] U.S. Cl. ........................................ 331/25; 331/22; 307/512; 328/134; 328/155
[58] Field of Search ............... 307/511, 512, 514, 515; 328/133, 134, 155; 331/25, 27, 22; 343/5 AF, 17.5; 455/212

[56] References Cited

U.S. PATENT DOCUMENTS

| | | | |
|---|---|---|---|
| 3,624,274 | 11/1971 | Araki et al. | 328/155 X |
| 4,041,533 | 8/1977 | Yamamoto et al. | 328/155 X |
| 4,085,378 | 4/1978 | Ryan et al. | 329/124 |
| 4,137,505 | 1/1979 | Guanella | 331/12 X |
| 4,143,322 | 3/1979 | Shimamura | 329/124 X |
| 4,156,204 | 5/1979 | Hargis | 331/12 |
| 4,164,624 | 8/1979 | Ogita | 329/124 X |
| 4,190,807 | 2/1980 | Weber | 328/155 X |
| 4,229,824 | 10/1980 | En | 328/155 X |
| 4,238,739 | 12/1980 | Mosley et al. | 331/25 X |
| 4,314,206 | 2/1982 | Attwood et al. | 329/124 X |
| 4,336,500 | 6/1982 | Attwood | 329/122 X |
| 4,344,178 | 8/1982 | Waters | 375/81 |

Primary Examiner—Stanley D. Miller
Assistant Examiner—W. R. Paxman
Attorney, Agent, or Firm—J. B. Hinson

[57] ABSTRACT

Quadrature detectors are subject to errors due to both phase and amplitude mismatches. The disclosed invention comprises a system for sampling the I and Q channel output signals of a quadrature detector and processing these signals to generate a signal which has a predetermined relationship to the phase error in the in-phase and quadrature signals independent of amplitude mismatches in said signals. The necessary mathematical computations can be performed by analog or digital circuitry. Phase error correction can be accomplished by a servo loop which changes the relative phase of the reference signals to the I and Q channels or by mathematically correcting the I and Q channel output signals to reduce the phase error.

4 Claims, 3 Drawing Figures

GAIN IMBALANCE CORRECTED QUADRATURE PHASE DETECTOR

This application is a continuation of application Ser. No. 06/270,668, filed June 4, 1981, now abandoned.

BACKGROUND OF THE INVENTION

1. Field of the Invention

The invention relates to communications systems and more particularly to a a quadrature detector which includes correction apparatus for correcting errors due to phase imbalance in the I (in phase) and Q (quadrature) channels.

2. Description of the Prior Art

In prior art systems, such as radar receivers, employing quadrature detectors errors in the quadrature detector due to phase imbalance were common. Errors due to amplitude and phase imbalance are interrelated making accurate compensation for each of these errors more difficult. Complexity of correcting phase imbalance errors, has limited prior art correction efforts. As the operating frequency of modern systems increases, correction of phase errors becomes more important. Correction of errors due to phase imbalance is simplified and improved by the system which is the subject of this invention by employing a correction circuitry and techniques which are substantially independent of amplitude imbalance problems.

SUMMARY OF THE INVENTION

The invention comprises a quadrature detector which includes circuitry responsive to the in-phase and quadrature signals to generate a signal having a predetermined relationship to the phase error of the in-phase and quadrature signals. In one embodiment the signal having a predetermined relationship to the phase error in the in-phase and quadrature signals is utilized in a servo loop to change the phase of a reference signal to reduce the error. In another embodiment a signal is provided which permits the in-phase and quadrature signals to be mathematically modified to correct the error.

DESCRIPTION OF THE PREFERRED EMBODIMENT

The preferred method reducing the errors in a quadrature detector due to phase imbalance requires that the phase error be determined and the phase of the reference signals of the I (in-phase) and Q (quadrature) channels be adjusted to reduce the error. Alternatively, the phase errors can be determined and the output signals of the I and Q channels can be modified to eliminate or reduce the error without changing the phase of the reference signals to the I and Q detectors. In either case, it is necessary to analyze the I and Q output signals of the quadrature detector to determine the phase error.

In typical radar systems, for example, the output signals of both the I and Q channels are in the general form of a sine wave. If the I channel output signal is represented as (A sin x) and the Q channel output signal is represented as (B sin y), the sum of this I and Q channel output signals is $$A \sin x + A \sin y + (B-A) \sin y$$

or $$2A \sin \tfrac{1}{2}(x+y) \cos \tfrac{1}{2}(x-y) + (B-A) \sin y$$

If $y = x + \theta$ where $\theta$ is constant, then $$A \sin x + B \sin(x+\theta) = 2A \cos \theta/2 \sin(x+\theta/2) + (B-A) \sin(x+\theta)$$

This expression can be normalized to $$\frac{A \sin x + B \sin(x+\theta)}{A} = 2 \cos \frac{\theta}{2} \sin\left(x + \frac{\theta}{2}\right) + \frac{B-A}{A} \sin(x+\theta).$$

The above function has a peak value when

A=B and a zero value when $\theta = m\pi$; m = odd integer.

In a quadrature detector, $\theta$ is the angle between the I and Q output signals and is normally in the neighborhood of 90°. The function shows the error as a separable function of the imbalance in gain with this error being equal to $$\frac{B-A}{A} \sin(x+\theta).$$

Since $\theta$ is constrained to the vicinity of 90°, the error can be approximated by:

Error = 0.707 B−A/A

Incorporating this into the phase error equation results in an overall phase error equation as follows:

$$\phi(\text{error}) = \left[\frac{A \sin x + B \sin y}{A} - 0.707 \frac{B-A}{A} - 1.414\right] K$$

where K is a slope constant dependent on angular units of measurement.

In accordance with the teachings of this invention apparatus for calculating the phase error using this equation, is provided. The results of this calculation can be used to correct the I and Q signals for phase error reference signal of the I and Q channels to reduce the mismatch. The net result is the same, in that I and Q channel signals are generated which are substantially free of errors due to phase imbalance in the I and Q channels.

Figure 1:
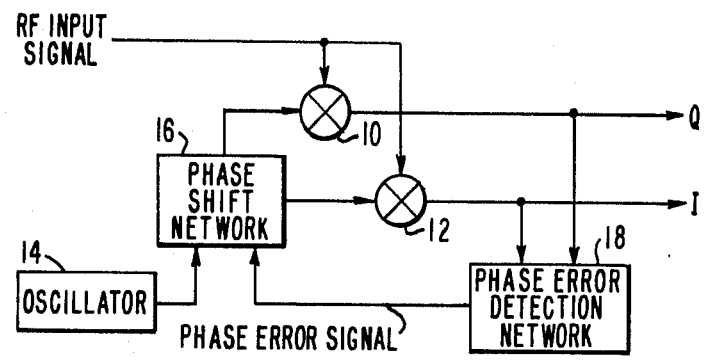
FIG. 1 is a functional diagram illustrating the phase imbalance correction system.

FIG. 1 is a functional block diagram of the preferred embodiment of the invention. In general, the phase correction scheme discussed and illustrated in FIG. 1 can either operate at the basic system RF frequency, i.e., the carrier frequency of a radar system for example, or it may be applied at the IF or other convenient frequency. In either case the systems function identically and the description described below is equally applicable to all situations. However, considering the current state of the art, the higher the operating frequency of the I and Q channels, the more important the correction for phase imbalance (mismatch) becomes. Additionally, as the frequency of the reference increases, it becomes more difficult to accurately measure and adjust the relative phase of the reference signals as a part of normal system calibration.

In the embodiment illustrated in FIG. 1, an RF input signal to be detected is coupled to a first input of first and second quadrature detectors, 10 and 12. A stable oscillator 14 provides an RF signal which is divided into two reference signals separated from each other by a phase difference of approximately 90° by a variable phase-shift network 16. These signals are coupled to the second inputs of the quadrature detectors 10 and 12. The output signals of the quadrature detectors 10 and 12 are the conventional I and Q signals associated with quadrature detection systems.

The I and Q signals appearing at the outputs of the mixers 10 and 12 are coupled to an phase compensation network 18. It is contemplated that this compensation network will be implemented by a digital computer suitably programmed. However, it should be emphasized that the phase error compensation network 18 can also be implemented with analog circuitry.

As a result of the calculations performed by the phase error compensation network 18, a phase error signal is generated which is used to adjust the variable phase shift network 16 to adjust the phase of the reference signals of the quadrature detectors to reduce the phase error. However, it should be emphasized that changing the phase of the reference signals to reduce the phase error does not correct quadrature detector errors due to amplitude imbalance. If corrections for quadrature detector amplitude imbalance are desired, they may be independently implemented in a conventional fashion. In most cases, fixed gain adjustments which are set as a part of the overall system calibration are an adequate and convenient method of compensating for gain imbalance.

Figure 2:
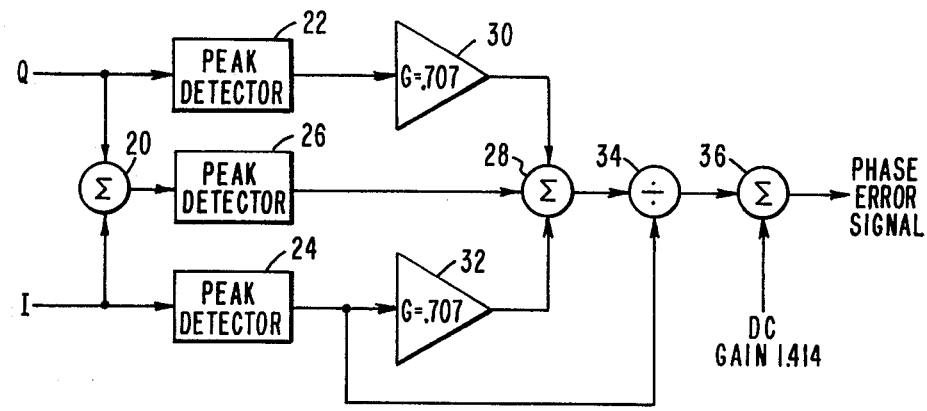
FIG. 2 is a diagram of a first implementation of the phase imbalance correction system.

FIG. 2 is a block diagram illustrating a first implementation of the phase error detection network 18. Functionally the output signal of the Q channel is coupled as a first input to a summer 20 and a peak signal level detector 22. Similarly, the output signal or the I channel is coupled to the second input of the summer 20 and a second peak signal level detector 24. In general the Q and I signals are complex sinusoidal wave forms. Similarly, the output signal of the summer 20 will be a complex sinusoidal waveform. A third peak signal level detector 26 detects the peak value of the output signal of the summer 20 and couples the resulting signal to a first input to a second summer 28. Two amplifier circuits 30 and 32, respectively, amplify the output signals of peak detectors 22 and 24 by 0.707 of their original value and couple the results as input signals to the second summer circuit 28.

A divide circuit 34 accepts as input signals the output signal of the second summer 28 and the output signal of peak detector circuit 24 to divide the output of the summer by the peak value of the I channel output signal. This divider normalizes the error signal such that it is dependent of signal amplitude and provides the error signal with a consistent slope characteristic. A third summer 36 adds the output of the divide circuit 34 to a scaler having a value of 1.414 to produce the phase error signal due to phase imbalance. In general the error signal will have a zero value when the relative phase of the I and Q signals are proper. This signal may be coupled back to the I and Q detector circuits to adjust the phase of the reference signals to achieve the proper relationships between the I and Q signals as illustrated in FIG. 1 or it may be used to mathematically correct the I and Q channel output signals.

Figure 3:
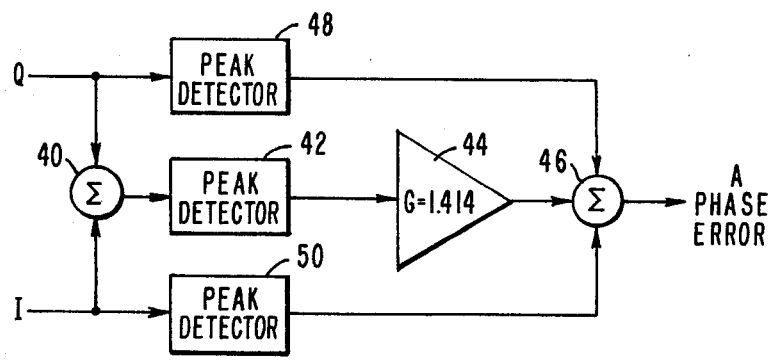
FIG. 3 is a diagram illustrating an alternate implementation of the phase correction technique.

FIG. 3 is a second implementation of the phase error detection circuit. In this implementation the I and Q channel output signals are coupled to the inputs of and summed by a first summer 40. A peak detector circuit 42 generates an output signal representative of the peak of the sum of the I and Q channel output signals. An amplifier circuit 44 amplifies this signal by 1.414. Peak signal level detectors 48 and 50, respectively, detect the peak values of the I and Q signals and couple the results to second and third inputs of the second summer 46 to produce at the output of the second summer an error signal equal to the phase error multiplied by the amplitude of the I and Q signals. This signal can be utilized to adjust the phase of the reference signals to achieve the desired relationship. Thus the basic functional difference between the two embodiments is that the error signal has a higher magnitude which is also dependent of the amplitude of the I and Q signals. This correction system may be inconvenient in servo type correction systems due to the variable slope nature of the error system. Alternatively, the phase error signal can be used to mathematically correct the output signals of the I and Q channels to reduce the phase error.

It is contemplated that the system described above will be useful in radar systems. In most of these systems a computer for data analysis will probably aleady be present. Under this circumstances it is contemplated that the correction schemes illustrated in both FIGS. 2 and 3 will be implemented digitally to correct the I and Q signals for phase imbalance errors. However, it should also be emphasized that these techniques could also be implemented using commercially available analog hardware. Additionally, the error signal can be used to operate a servo loop to change the relative phase of the reference signals to reduce errors due to phase imbalance as illustrated in FIG. 1.

The invention has been described with reference to three embodiments illustrated in FIGS. 1, 2 and 3, with the embodiment illustrated in FIG. 2 believed to be the most advantageous embodiment. However, it must be emphasized that many variations are possible. For example, the gain of the three signal channels providing input signals to the second summing circuit (reference numeral 28, FIG. 2) can be changed so long as the relative gain of the channels is proper. Amplifier or attenuator could also be used prior to the peak detectors 22, 24 and 26. Similar changes could also be utilized in the other embodiments illustrated. Other changes dictated by or taking advantage of specific hardware used to implement the invention are also possible.

What we claim is:
1. An apparatus for correcting errors in a quadrature detector comprising:
   (a) an oscillator for generating a first reference signal;
   (b) phase shift means for receiving said first reference signal and producing second and third reference signals having the same frequency as said first reference signal and a phase difference 1 in response to a phase error signal, of approximately 90°;
   (c) first and second quadrature detector circuits responsive to said second and third reference signals and to an RF input signal to generate in-phase and quadrature output signals;

(d) phase error apparatus responsive to said in-phase and quadrature output signals for generating said phase error signal, said phase error apparatus including:
   (1) first and second circuit means for respectively determining the peak amplitude of said in-phase and quadrature signals, and for generating first and second signals indicative of the peak amplitude of these signals;
   (2) third circuit means for determining the peak amplitude of the sum of said in-phase and quadrature signals and generating a third signal indicative of this amplitude;
   (3) fourth circuit means for combining said first, second and third signals to produce said phase error signal.

2. An apparatus for determining the phase error in the in-phase and quadrature output signals respectively generated by first and second detector cicuits of a quadrature detector, comprising in combination:
   (a) first summing means for combining said in-phase and quadrature signals of said first and second detector circuits to generate a sum signal;
   (b) first circuit means for generating first, second and third signals, the amplitude of each of said first, second and third signals respectively having a predetermined relationship to the peak amplitude of said in-phase, quadrature and sum signal;
   (c) second means for combining said first, second and third signals to generate an error signal; and
   means for scaling said error signal to generate a phase error signal.

3. An apparatus for correcting phase errors in a quadrature detector, comprising in combination:
   (a) circuit means for generating first and second reference signals having the same frequency and a phase difference determined by a phase error signal;
   (b) first and second circuits respectively responsive to said first and second reference signals and an RF input signal to generate in-phase and quadrature output signals;
   (c) phase error apparatus responsive to said in-phase and quadrature output signals for generating said phase error signal, said phase error apparatus including:
      (1) first and second circuit means for respectively determining the peak amplitude of said in-phase and quadrature signals, and for generating first and second signals indicative of the peak amplitude of these signals;
      (2) third circuit means for determining the peak amplitude of the sum of said in-phase and quadrature signals and generating a third signal indicative of this amplitude;
      (3) fourth circuit means for combining said first, second and third signals to produce said phase error signal.

4. Method of operating a quadrature detector comprising the steps of:
   (1) utilizing an oscillator to generate a reference signal;
   (2) coupling the output signal of said oscillator to a phase shift network to generate first and second reference signals having the same frequency as the output signal of said oscillator and a phase difference, in response to a phase error signal, of substantially 90°;
   (3) coupling said first and second reference signals and an RF input signal to first and second quadrature detection circuits to produce in phase and quadrature output signals;
   (4) coupling said in phase and quadrature signals as input signals to a phase error network which includes means for detecting the peak values of said in phase and quadrature signals and the peak value of the sum of said in phase and quadrature signals and combining these peak values to generate said phase error signal.

* * * * *